(12) United States Patent
Galewski et al.

(10) Patent No.: US 10,294,562 B2
(45) Date of Patent: May 21, 2019

(54) EXHAUST MANIFOLD IN A CVD REACTOR

(71) Applicant: AIXTRON SE, Herzogenrath (DE)

(72) Inventors: Carl Galewski, Santa Cruz, CA (US); Stephen Edward Savas, Fremont, CA (US); Merim Mukinovic, Würselen (DE)

(73) Assignee: AIXTRON SE, Herzogenrath (DE)

( * ) Notice: Subject to any disclaimer, the term of this patent is extended or adjusted under 35 U.S.C. 154(b) by 308 days.

(21) Appl. No.: 15/091,412

(22) Filed: Apr. 5, 2016

(65) Prior Publication Data

US 2017/0283946 A1    Oct. 5, 2017

(51) Int. Cl.
| | |
|---|---|
| *C23C 16/44* | (2006.01) |
| *C23C 16/455* | (2006.01) |
| *C23C 16/50* | (2006.01) |
| *H01J 37/32* | (2006.01) |

(52) U.S. Cl.
CPC ........ *C23C 16/4412* (2013.01); *C23C 16/455* (2013.01); *C23C 16/45563* (2013.01); *C23C 16/50* (2013.01); *H01J 37/32834* (2013.01)

(58) Field of Classification Search
USPC ............................ 118/733, 715, 50, 725, 729
See application file for complete search history.

(56) References Cited

U.S. PATENT DOCUMENTS

| | | | |
|---|---|---|---|
| 5,938,851 A | * | 8/1999 | Moshtagh ............. C23C 16/455 118/715 |
| 6,890,386 B2 | | 5/2005 | DeDontey et al. |
| 8,697,197 B2 | | 4/2014 | Savas et al. |
| 8,758,512 B2 | | 6/2014 | Lee |
| 2009/0081885 A1 | | 3/2009 | Levy et al. |
| 2014/0205769 A1 | | 7/2014 | Lee |

FOREIGN PATENT DOCUMENTS

WO    2014/210613    12/2014

* cited by examiner

*Primary Examiner* — Yewebdar T Tadesse
(74) *Attorney, Agent, or Firm* — Ascenda Law Group, PC

(57) ABSTRACT

Described herein is an exhaust manifold (1) comprising suction opening (2), a gas extraction chamber (3), an intermediate space (9), a gas collection chamber (5) and a suction line (4). A flow-impeding structure may be present within the intermediate space (9). The flow impeding structure may exert a flow resistance on the gas flow which is greater in a central zone (Z) than in edge zones (R) of the intermediate space (9), causing gas to flow into the suction opening (2) at a substantially uniform gas flow speed across the cross section of the suction opening (2).

11 Claims, 10 Drawing Sheets

EXHAUST MANIFOLD IN A CVD REACTOR

FIELD OF TECHNOLOGY

Apparatus for exhausting a process gas from a coating system, in particular a CVD or PVD reactor comprising an extraction unit having a flow channel, wherein the flow channel comprises a suction opening, an adjoining gas extraction section in a flow direction and a gas collecting chamber disposed downstream of the gas extraction chamber in the flow direction and opening into a suction line, wherein the length of the suction opening extending in a long side direction is substantially greater than the width extending in a narrow side direction. The gas extraction section and the gas collecting section are delimited in such a manner by long side walls extending in the long side direction and narrow side walls extending in the narrow side direction that a gas flow is formed in the flow channel as a result of a negative pressure produced in the suction line.

The invention further relates to a CVD reactor and in particular a plasma CVD reactor with an electrode arrangement, a gas inlet unit for feeding a process gas into the process chamber and an extraction unit for extracting the process gas from the surface of the substrate.

PRIOR ART

An apparatus for plasma coating of a substrate is described in U.S. Pat. No. 8,697,197 B2. The apparatus described there, which is further developed by the apparatus according to the invention, has a gastight housing in which a substrate is disposed on a support, which is transported in a transport direction underneath an electrode arrangement. The electrode arrangement extends transversely to the transport direction of the substrate over the width thereof and has a first gap into which a process gas is fed through a gas inlet unit. A first plasma is generated between the electrodes, and a second plasma is generated between the electrodes and the substrate. The process gas flowing through the gap between first, facing sides of the two electrodes and the substrate is exhausted through an extraction device on a side of an electrode opposite the first side of an electrode. A relevant exhaust manifold has a hood-like housing with a suction opening open towards the substrate. The suction opening is adjoined by a gas exhaust manifold in which a gas flow results from negative pressure in a suction line.

In addition, US 2009/0081885 A1, U.S. Pat. No. 6,890,386 B2, US 2014/0205769 A1 and U.S. Pat. No. 8,758,512 B2 belong to the prior art.

The extraction unit described above in the form of an extraction hood with a suction opening which has a substantially rectangular suction throat or opening, having a length which is substantially greater than the width. This unit has the property that in a central zone which is disposed in the longitudinal centre of the suction throat or the horizontal cross-section of the gas extraction chamber a higher suction is formed than in edge zones which lie between the central zone and the respective ends of the suction opening or the gas collecting chamber. The non-uniformity of the gas flow inside the extraction unit caused by the non-uniform suction results in inhomogeneities in the layer deposited on the substrate. Such convergent flows may have a tendency that deposits adhering to the side walls in the gas extraction chamber or gas collecting chamber can become detached and drop onto the substrate. Here, in particular this involves silicon compounds adhering to the long side walls. This property has the consequence that the walls of the gas extraction chamber or the gas collecting chamber must be cleaned at short time intervals.

SUMMARY OF THE INVENTION

The invention is based on the object of improving the apparatus described initially for the extraction of a process gas from the volume adjacent the surface of a substrate in a CVD reactor in a manner advantageous for use.

The objective is achieved by the invention specified in the claims. The subclaims not only form advantageous further developments of the equivalent claims but also an independent solution of the object.

The apparatus according to the invention has an exhaust manifold which has the function of an extraction hood. With the features specified in the claims, the gas flow in the region of a restriction located between gas extraction section and gas collecting section is confronted with a greater flow resistance or flow restriction in a central zone of a cross sectional area than in end zones of the cross-sectional area. For this purpose, flow-impeding structures or restrictions in the narrow dimension of the flow channel are provided in the central zone, which act in the manner of a local throttle. The flow-impeding structures result in a more uniform gas flow speed entering the suction surface in the region of the suction opening. The suction through the suction opening is reduced by these measures in the central zone to the value of the suction in the end regions. The intermediate space having the flow-impeding structure or restriction can be locally restricted to the central zone. However, the intermediate space between central and end zones can also extend as far as the narrow side walls. The central and intermediate space is characterized in that it has flow-impeding structures which extend through some part of the distance between the suction opening and the port leading through a vacuum pumping line to the vacuum pump. It is in particular provided that the flow impeding structure has locally different extension heights in the flow direction. These extension heights extend in a direction that we may call "vertical", which are generally parallel to the flow direction from the center of the suction opening toward the vacuum pumping port. This direction is transverse to the long side direction and transverse to the narrow side direction. Thus, it is provided in particular that the height of the flow impeding structure or restriction, extending in the height direction in the flow direction in the lateral center of a cross-sectional area through the flow volume of the exhaust manifold, is greater than at end locations in the direction of the long side wall. In some embodiments the restriction may have a lower edge relative to the height direction which extends substantially parallel to the suction opening. A second upper edge of the restriction may lead to a region whose narrow dimension is greater than it is within the restriction and the edge of this region which adjoins the gas collecting section may be inclined to the first edge which in particular runs transversely to the flow direction so that the measured height of the restriction in the flow direction increases continuously from the edge zones as far as the lateral center. In one embodiment of the invention, it is provided that the flow-impeding structures or restriction are formed by the long side walls of the intermediate space. The long side walls of the restriction extend from an edge pointing towards the suction opening to an edge pointing towards the suction line. The long side walls of the restriction preferably running parallel to one another are closer to one another than the long side walls either below or above this restriction, for example, running parallel to one another in the gas extraction chamber or in the gas collecting chamber. However, the long side walls the gas extraction section or gas collection section, whether below or above the restriction can also run at an inclination to one another or have sections running at an inclination to one another. It is then provided that the spacing of the long side walls of the restriction is smaller than the smallest spacing of the long side walls preceding or following said restriction along the flow direction. The long side walls extend in the direction of the length of the suction opening and in a direction transversely thereto, in the height direction. The length of the restriction is substantially greater, in particular at least four times as great as the width of the suction opening extending transversely to the length in a narrow side direction. The narrow side walls can run parallel to one another in the region of the gas extraction chamber and, if the intermediate space extends as far as the narrow sides, also in the restriction and/or between restriction and vacuum pumping port. Preferably however the narrow side walls run at an inclination to one another relative to the height direction in the gas collecting section above the restriction so that the gas collecting chamber tapers in a funnel shape at least with respect to the narrow side walls to an opening, where the gas collecting chamber opens into the suction line in which a negative pressure is generated by a vacuum pump. The restriction forms a flow-influencing region with flow impeding structures which may extend over the entire volume between the suction opening and an upper boundary whose shape can be determined by simulation calculations. In said simulations the target parameter of the simulation calculation is the local velocity of the gas flow into the suction opening, so that this is as close as possible to constant over the entire suction opening area. In the simulation calculation, in particular the height of the flow-impeding zone measured in the flow direction is varied in such a manner that the flow velocity of the gas flow in the lateral center of the suction opening is approximately the same as the flow velocity in the region near the ends of the suction opening. The flow-influencing zone can extend over the entire cross-sectional area of the extraction channel between suction opening and suction line. However, it is also provided that the restriction only extends over part of the exhaust manifold in the vertical direction. In some embodiments the suction opening and the adjoining gas extraction section may have a substantially rectangular cross section. The width can lie between 10 mm and 30 mm. The length of this cross sectional area is at least four times as great as the width, preferably more than ten times as great. The spacing of the long side walls in the restriction can lie between 1 mm and 10 mm. Preferably this spacing is in a range between 2 mm and 6 mm. As a result of the increased flow resistance in this region, a higher flow velocity is formed inside the restriction. This results in a higher local pressure drop in the center of the intermediate space than in the end region. With the further development of the extraction unit according to the invention, a vertical flow is produced, the flow velocity of which varies over the surface of the suction opening by a reduced extent compared to the prior art. The suction developed by the gas flow is thus approximately the same in the region of the central zone as in the end zones. As a consequence of the configuration according to the invention, the dwell time of the gases inside the flow channel between suction opening and vacuum pumping port is furthermore reduced, which results in a reduction of the deposits of condensates on the surfaces of the side walls of the flow channel. Furthermore, the flow velocity of the gas in the region of the suction opening or in the restriction directly above, is substantially homogeneous over the entire cross-sectional area. In some embodiments where the length of the suction opening is not more than about 600 mm the measured height of the flow-impeding zone measured in the flow direction may vary from about 5 cm in the region of the lateral center of the flow channel to 1 cm or less than 1 cm in the region of the narrow side edge of the flow channel. The height of the flow-influencing zone measured in the flow direction decreases from the lateral center of the flow channel towards the narrow edge, in particularly continuously and smoothly. As a result, the flow at the edge experiences a lower resistance than in the region of the center. Nevertheless, the flow lines of the gas flow run substantially parallel to one another inside the flow channel as far as the upper boundary of the restriction. It is further provided that in the transition region between gas collecting section and restriction or in the transition region between restriction and gas collection section immediately above the restriction, the long side walls go over into one another free from kinks, rounded in the flow direction so that flow separation at edges and the formation of vortex or recirculation flows is avoided. In another embodiment of the invention, it is provided that the height of the flow-influencing zone measured in the flow direction lies between 10 mm and 100 mm, the spacing of the two long side walls (forming the restriction) there is between 2 mm and 8 mm, whereas the spacing of the long side walls in the gas extraction chamber located between suction opening and flow-impeding zone lies between 10 mm and 25 mm. The flow channel preferably has the same length as the suction opening at that point where the flow-impeding zone, i.e. the intermediate space, is located. The length of the cross-section of the flow channel only decreases in the gas collecting section of the exhaust manifold above the flow-impeding zone. The region above the restriction may have a section in which the long side walls run at an inclination to one another. The cross-sectional area of the manifold thus decrease in the flow direction. Between this section having the inclined long side walls and the vacuum pumping opening, the gas extraction section of the manifold can have a zone with long side walls running parallel to one another. In the region of the suction opening the cross-sectional area of the flow channel can have a maximum. In some embodiments, the flow channel here may have a short section of enlarged cross-section for some distance in the height direction. It may also be enlarged there in the narrow side direction. In a preferred further development of the invention, a plurality of extraction units are an integral part of a housing which has an electrode arrangement for generating a plasma. The electrode arrangement can comprise two elongated electrodes running parallel to one another, between which a gas inlet gap is arranged. The electrodes have two long side surfaces pointing away from one another. These long side surfaces can form the long side walls of the flow channel. In particular, they form a long side wall of the gas extraction section. The intermediate space can be formed by an insertion body which is inserted into a corresponding recess of the housing in order to form the reduced cross-section region of the flow channel.

BRIEF DESCRIPTION OF THE DRAWINGS

The invention is explained in detail hereinafter with reference to the appended drawings. In the figures.

DESCRIPTION OF THE EMBODIMENTS

Figure 11:
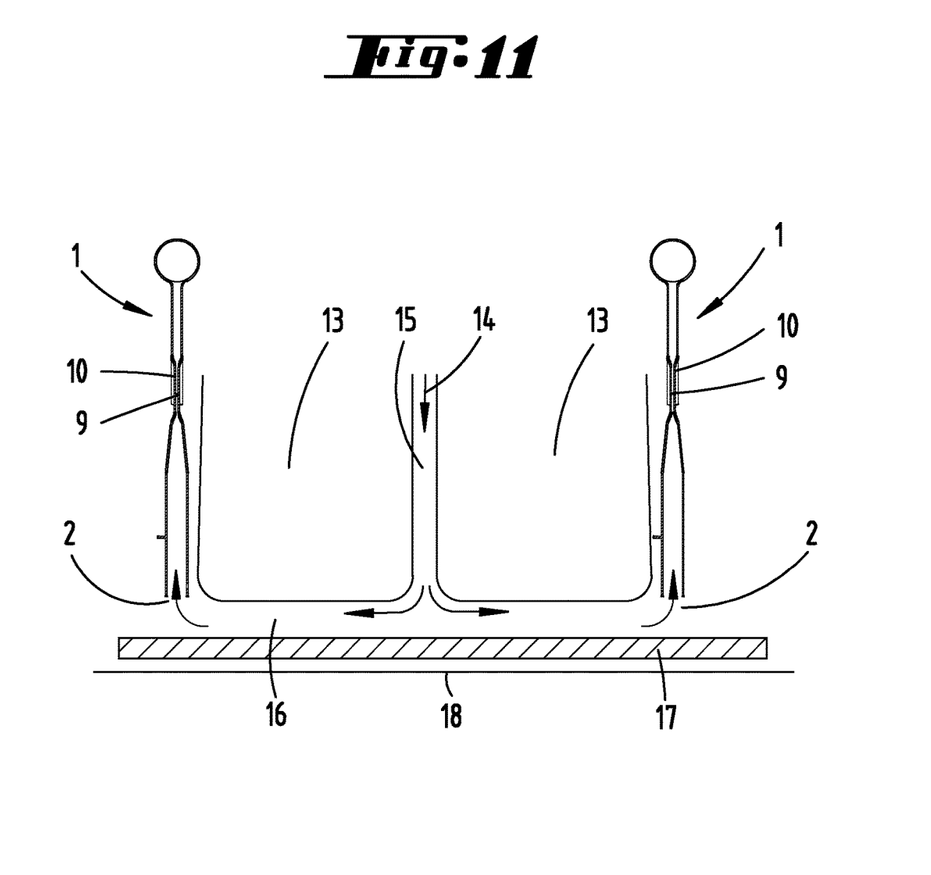
FIG. 11 shows schematically the arrangement of two extraction units next to two plasma electrodes 13 in an apparatus as described in U.S. Pat. No. 8,697,197 or WO 2014/210613. The disclosure content of these two documents is therefore completely included in its full content in the disclosure content of this application.

FIG. 11 shows an example of application of an extraction unit 1 in the form of an extraction hood in a plasma CVD reactor. A substrate 17 which is to be coated with a protective layer lies on a support 18. Located above the substrate 17 are two plasma electrodes 13 which are spaced apart from one another so that a gap 15 is formed between two plasma electrodes 13 through which a process gas 14 is fed into the gap 15. A first plasma is located in the gap 15. The process gas 14 flows through a second gap 16 which is located between substrate 17 and an underside of the electrode 13. The support 18 can be a third electrode so that a plasma can also form in the gap 16. Additional feed openings not shown can further be provided, through which further process gases can be fed, for example, only into the second gap 16 or downstream in the first gap 15 into the gas flow. The process gas is extracted from the surface of the substrate 17 with the extraction hood 1. For this purpose the exhaust manifold 2 has a suction opening 2 which extends over the entire width of the substrate. The support 18 is capable of conveying the substrate 17 in the direction of its longitudinal extension direction. The extraction unit 1 extends parallel to the electrodes 13 and parallel to the gaps 15, 16 over the entire width of the support 18.

FIGS. 1 to 4 show a first exemplary embodiment of the invention in which the extraction unit 1 has the form of an extraction hood. The extraction hood has a flow channel which extends in the flow direction from a suction opening 2 as far as a suction line 4. A vacuum pump is connected to the suction line 4 in order to produce a negative pressure so that a gas flow with the flow direction S forms inside the suction channel. The suction opening 2 has a rectangular cross-section with a length which extends in a long side direction L and which is at least four times, preferably at least ten times as great as a width of the suction opening 2 which extends transversely to the long side direction L in a narrow side direction W. The suction opening 2 can have an extension which increases, for example doubles, its width so that the suction opening 2 goes over into a gas extraction section of the exhaust manifold 3 with reduced width. The gas extraction section 3 has a rectangular cross-section and is delimited by long side walls 6 which run parallel to one another and by narrow side walls 7 running transversely thereto. The narrow side walls 7 also run parallel to one another so that the flow volume enclosed by the side walls 7, 6 is rectangular. The distance between the two long side walls 6 is about 10 mm to 30 mm. The distance between the narrow side walls 7 can lie in the range between 200 mm and 1000 mm.

The height H of the gas extraction chamber 3 measured in the flow direction S, which runs in a height direction H which is perpendicular to the long side direction L and to the narrow side direction W, is preferably greater than 50 mm, particularly preferably greater than 70 mm. A region in which the long side walls (6) run parallel to one another can be adjoined by a section of the flow channel in which the long side walls run at an inclination to one another so that the cross-sectional area of the flow channel decreases in the height direction H.

In flow direction S, the gas extraction section 3 is followed by a restriction 9 which, since it has flow-impeding structures, forms a flow-influencing zone. The lower edge 11 of the restriction 9 pointing towards the suction opening 2 runs substantially parallel to the surface extension direction of the suction opening 2. The upstream edge 12 of the restriction 9 pointing towards the suction line 4 runs in a V shape. In the center (relative to the long side direction L), the edge 12 has its greatest distance from the edge 11 in the flow direction S. In the region of the narrow side walls 7 the edge 12 has its shortest distance from the edge 11 in the flow direction S. The edge 12 extends in such a manner with respect to the edge 11 that the height of the restriction 9 measured in flow direction S decreases from the center towards the edge.

Figure 3:
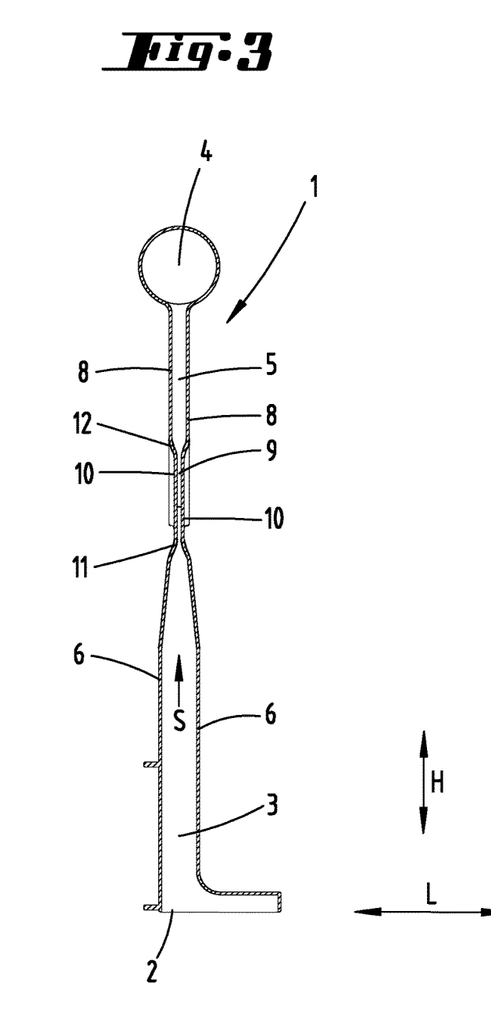
FIG. 3 shows the section along the line III-III in FIG. 2.

FIG. 3 shows that the long side walls 6 of the gas extraction section 3 running parallel to one another go over into long side walls 10 of the restriction 9 which are less spaced apart from one another, forming a rounded transition region in the region of the edge 11. The long side walls 10 of the restriction 9 run parallel to one another and have a spacing in the range between 1 mm and 10 mm, preferably in a range between 2 mm and 6 mm. In the region of the edge 12 the reduced-spacing long side walls 10 go over into long side walls 8 of a gas collecting chamber 5 free from bends, which adjoins the intermediate space in flow direction S.

Figure 4:
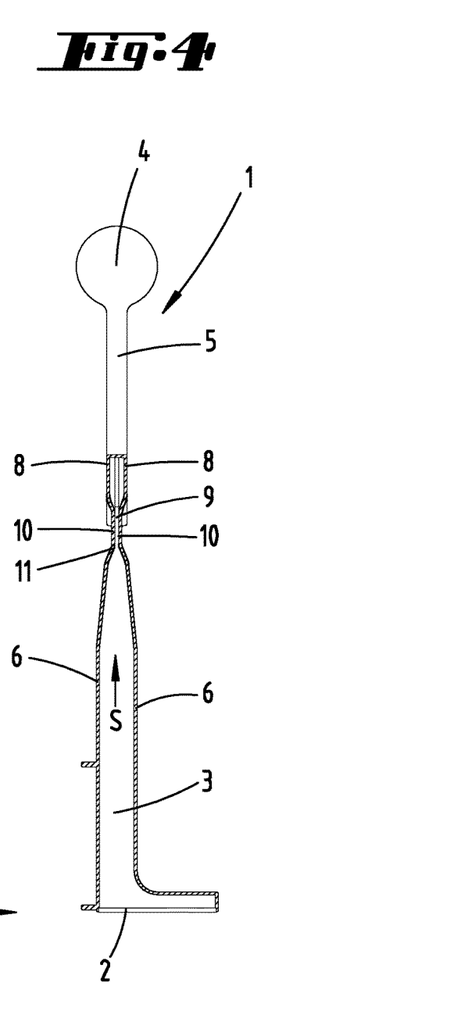
FIG. 4 shows the section along the line IV-IV in FIG. 2.
Figure 5:
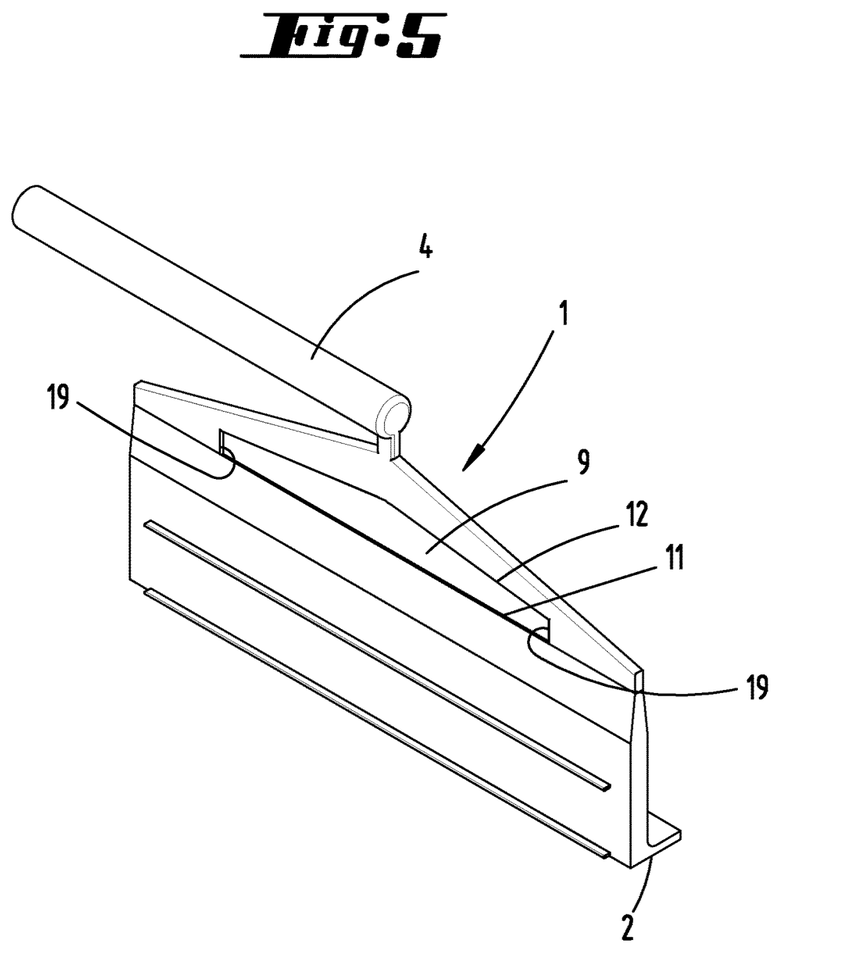
FIG. 5 shows a view according to FIG. 1 of a second exemplary embodiment.
Figure 6:
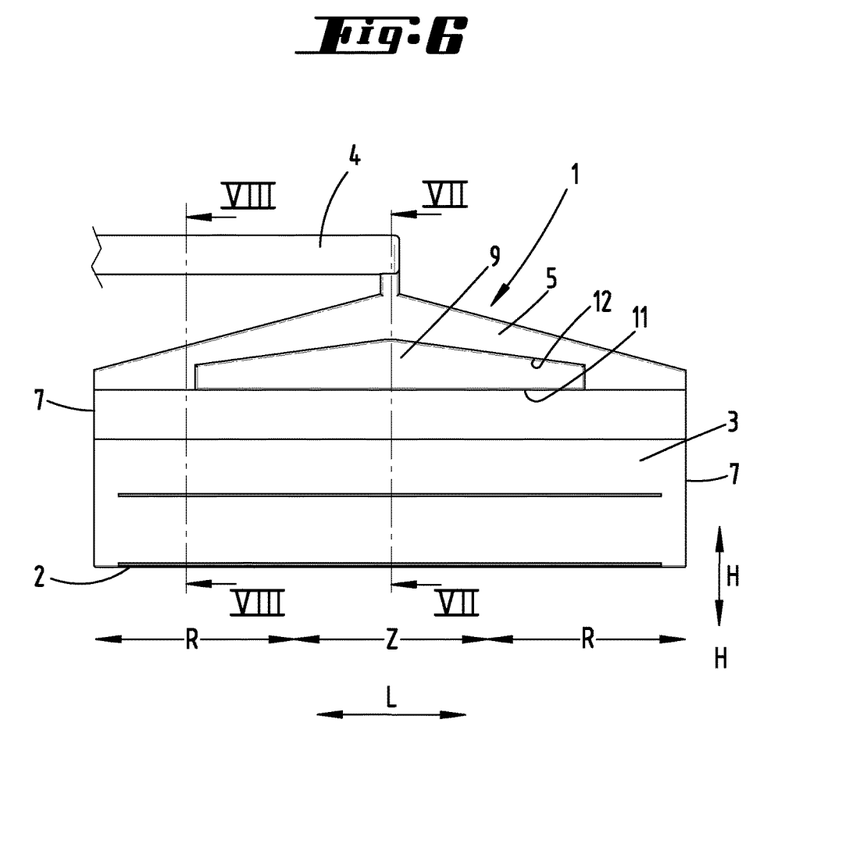
FIG. 6 shows a view according to FIG. 2 of the second exemplary embodiment.
Figure 7:
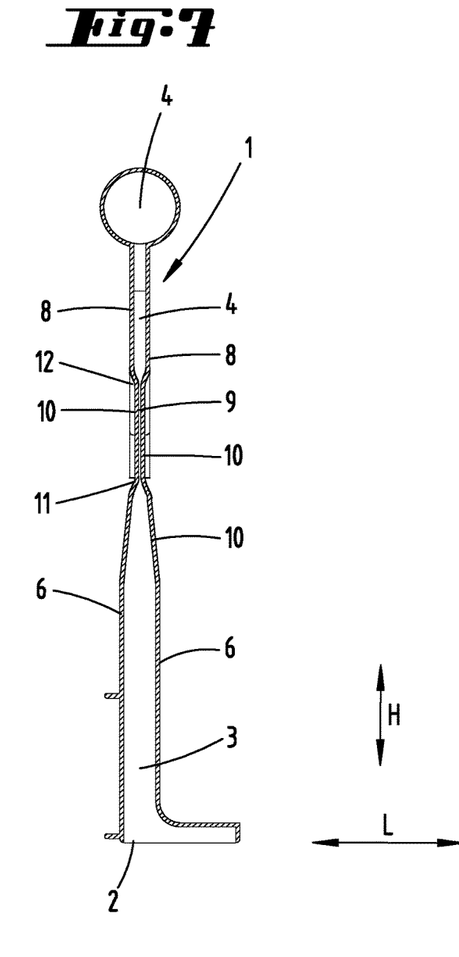
FIG. 7 shows the section along the line VII-VII in FIG. 6.
Figure 8:
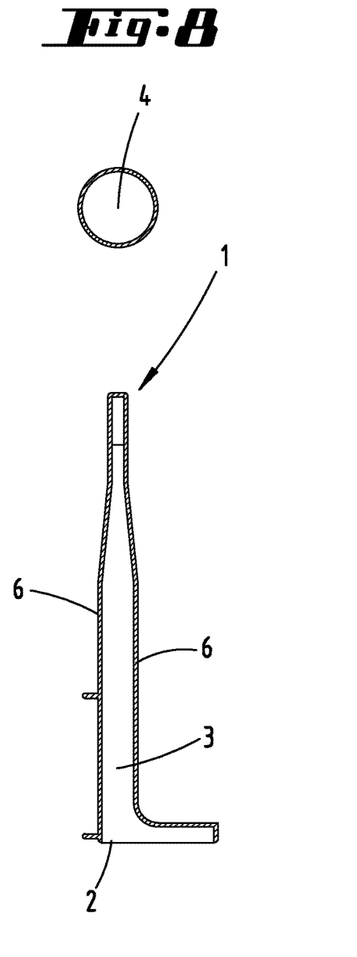
FIG. 8 shows the section along the line VIII-VIII in FIG. 6.

The narrow side walls 7 in the region of the restriction 9 have substantially the same spacing as they have in the region of the gas extraction section 3. However, the narrow side walls 7 run in the downstream region of the gas collecting chamber 5 obliquely with respect to one another into an orifice in which the suction line 4 adjoins the flow channel.

A central zone Z of the cross-sectional area of the flow channel extending transversely to the flow direction S extends in the long side direction L over the middle third of the cross-sectional area. The end zones R extend over the two outer cross-sectional areas in the long side direction L. As a result of the flow-impeding structures inside the flow channel, which in the exemplary embodiment is implemented by the reduced long side wall spacing 10 in the restriction 9, the gas flow in the central zone Z is confronted with a greater flow resistance than in the two edge zones R.

This has the result that the flow profile in the region of the suction opening 2 which is located at a distance from the restriction 9 in the flow direction becomes uniform.

Whereas in the first exemplary embodiment shown in FIGS. 1 to 4, the restriction 9 extends as far as the narrow side walls 7, i.e. over the entire cross-sectional area of the flow channel, the restriction 9 of the second exemplary embodiment shown in FIGS. 5 to 8 only extends over a partial region of the cross-sectional area of the flow channel. In this exemplary embodiment the edges 19 of the restriction 9 extending in flow direction S are spaced apart from the narrow side walls 7. The distance can lie in the range between 50 mm and 150 mm. In this edge region the cross-sectional area of the flow channel has the same width measured in narrow side direction W as it has in the region of the gas extraction section 3 or in the gas collecting section 5. In the region between the narrow edges 19 of the restriction 9, the distance of the long side walls 10 of the restriction 9 decreases however in the manner such as has been described above by reference to the first exemplary embodiment, so that the flow-impeding structures thereby formed confront the suction flow in the central region Z with a greater flow resistance than in the edge zones R.

Figure 9:
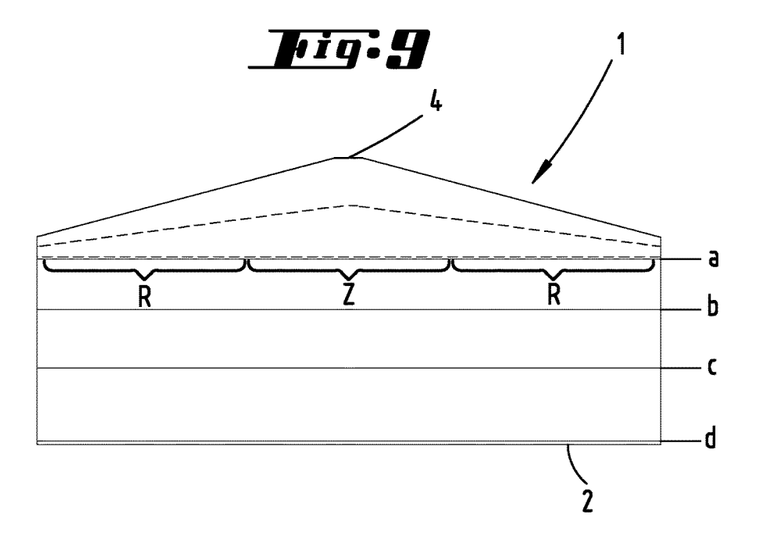
FIG. 9 shows a view through a longitudinal cross-section through the flow channel between suction opening 2 and suction line 4 to illustrate the position of the cross-sectional planes a, b, c, d.
Figure 10:
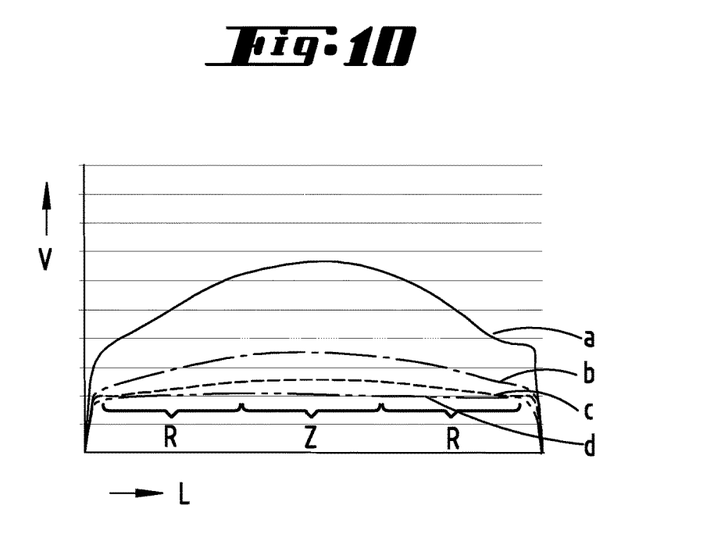
FIG. 10 shows a view of the velocity profile of the gas flow forming in the flow channel in the cross-sectional plane a—continuous curve, in the cross-sectional plane b—dot-dash curve, in the cross-sectional plane c—dashed curve and in the cross-sectional plane d—double-dash dot curve.

FIG. 10 shows the flow velocities in the region of the flow channel in different cross-sectional planes a, b, c, d. FIG. 9 shows the spatial position of the cross-sectional planes. In the plane d shown by the double dash dot line, which extends in the region of the suction opening 2, the flow velocity in the central zone Z is approximately the same as the flow velocity in the two edge zones R. As a result of the structures having the strongest influence on the flow at the centre, the velocity profile shown by the continuous curve in FIG. 10 forms in the plane a running directly upstream of the restriction 9, which shows a maximum of the flow velocity in the centre. This maximum of the flow velocity is accompanied by a maximum pressure drop in the flow direction there. At both edges the flow velocity decreases continuously so that a reduced pressure drop compared with the central region prevails. The upstream edge 11 of the intermediate space 9 is so far spaced apart from the suction opening 2 in flow direction S that a flow profile is formed in the region of the suction opening 2 in which the flow velocity in the central zone Z substantially corresponds to the flow velocity in the edge zones R where the flow velocity inside the central zone Z in the flow channel increases continuously with increasing distance from the suction opening 2 by a higher amount than the flow velocity in the two edge zones R. The flow velocity in the central zone Z and in the two edge zones R preferably differ from one another by a maximum of 5%.

Figure 1:
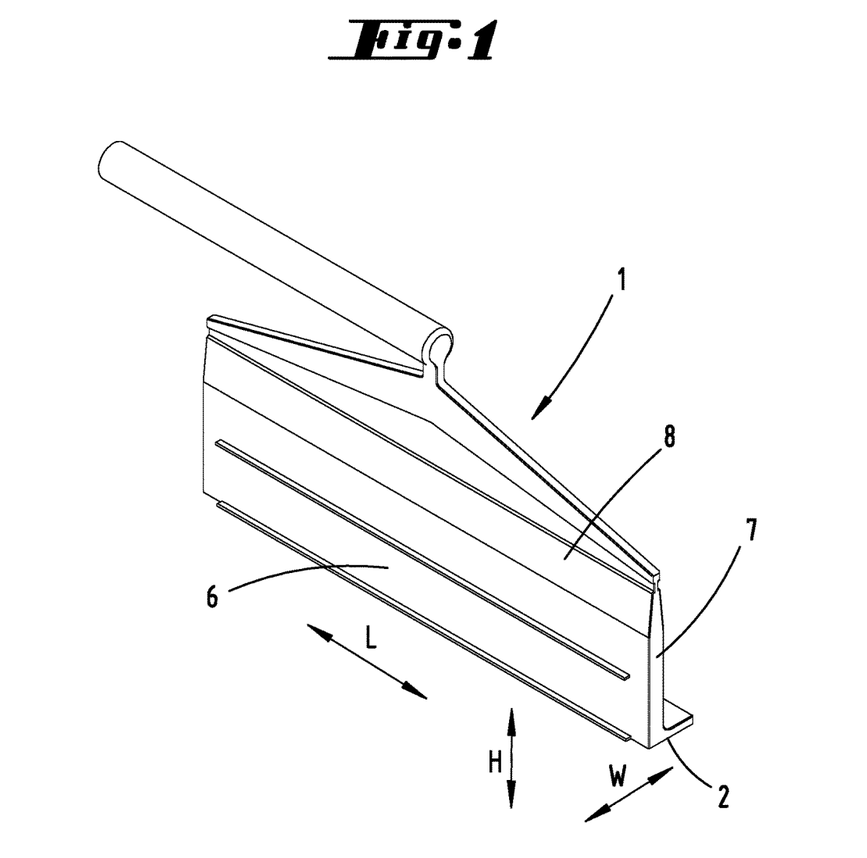
FIG. 1 shows a perspective view of an extraction unit of a first exemplary embodiment.
Figure 2:
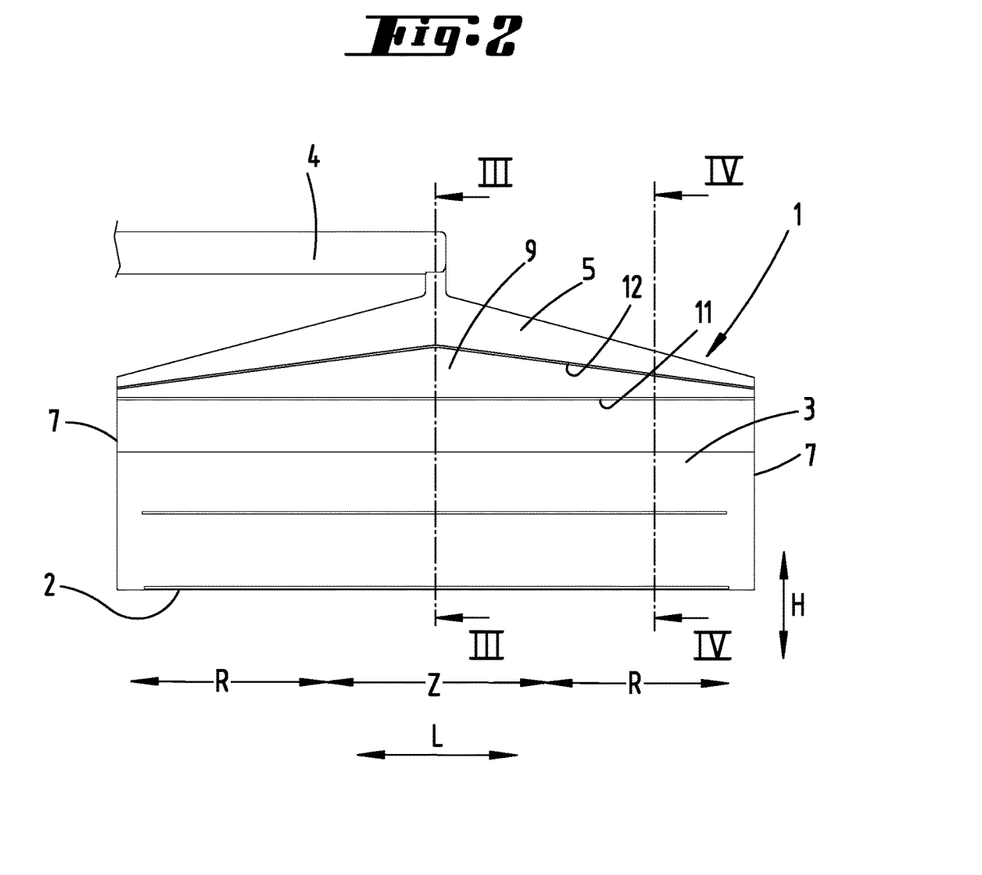
FIG. 2 shows the side view in the direction of the long side wall of the extraction unit or exhaust manifold.
Figure 12:
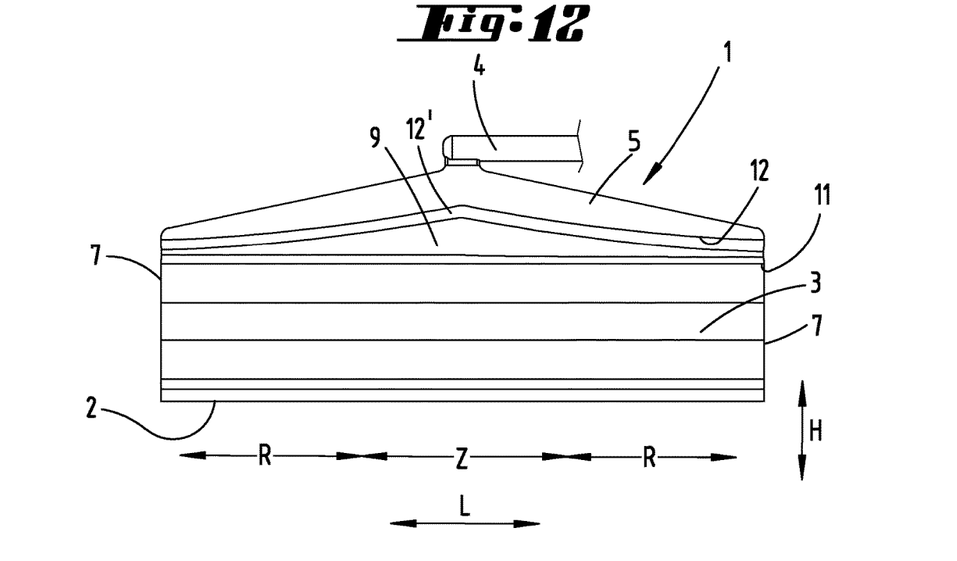
FIG. 12 shows a view according to FIG. 2 of a further exemplary embodiment.

FIG. 12 shows a further exemplary embodiment in a view according to FIG. 2.

The edge 12 of the restriction 9 pointing towards the suction side here has two sections each running on curved lines which meet in a central zone Z forming an apex 12'. The line on which the edge 12 runs has a greater gradient in the region of the apex 12' than in the region of the edge zones R.

Figure 13:
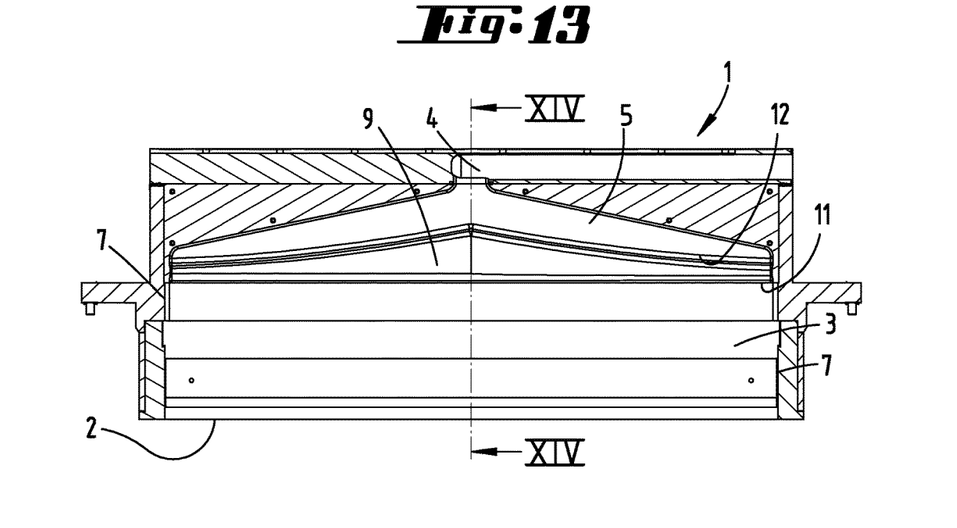
FIG. 13 shows a section along the line XIII-XIII of a further exemplary embodiment.
Figure 14:
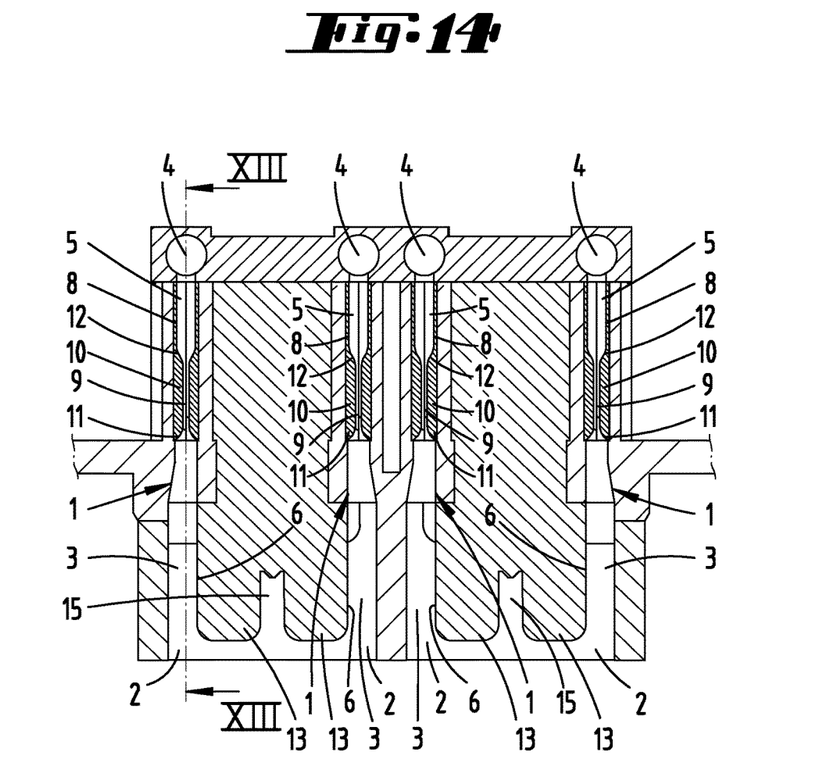
FIG. 14 shows the section along the line XIV-XIV in FIG. 13.

FIGS. 13 and 14 show an exhaust manifold as an integral part of a housing in which respectively two electrode pairs 13 are arranged between which respectively one gas inlet gap 15 is located. At least one long side wall 6 of the exhaust manifold 1 is here formed by a side wall of an electrode 13. The gas extraction chamber 3 here directly adjoins the suction opening 2. It has two long side walls 6 running parallel to one another. The cross-section of the extraction section 3 decreases in a downstream region before the edge 11 at which the restriction 9 begins in the flow direction, which at its downstream edge 12 goes over into a gas collection section with wider spacing of long parallel walls 5. This region 5 is adjoined in the flow direction by the vacuum port 4. A total of four extraction sections 1 are provided in the housing, each flanking an electrode pair 13.

The preceding explanations are used to explain the inventions covered by the application overall, which independently further develop the prior art at least by the following feature combinations, i.e.:

An apparatus which is characterized in that flow-impeding structures are provided in at least one restriction 9 between gas extraction section 3 and gas collecting section 5 which in a central zone Z located centrally between the narrow side walls 7 exert a greater flow resistance on the gas flow than in edge zones R arranged between the central zone Z and the narrow side walls 7.

An apparatus which is characterized in that the flow-impeding structures are formed by the long side walls 10 of the restriction 9 which are less spaced apart from one another there than in the gas extraction chamber 3.

An apparatus which is characterized in that in the centre of the central zone Z the flow-impeding structures have a height extending in a height direction which is greater than the height in the edge zones R.

An apparatus which is characterized in that the long side walls 6, 8, 10 each run approximately parallel to one another.

An apparatus which is characterized in that a first edge 11 of the intermediate space 9 pointing towards the suction opening 2 runs substantially parallel to the suction opening 2.

An apparatus which is characterized in that an edge 12 of the intermediate space 9 pointing towards the gas collecting section 5 runs obliquely to the edge 11 of the intermediate space 9 pointing towards the suction opening.

An apparatus which is characterized in that the long side walls 10 of the restriction 9 running between an edge 12 of the restriction 9 pointing towards the suction line 4 and an edge 11 of the intermediate space 9 pointing towards the suction opening 2 run parallel to one another and have a distance from one another which is greater than the smallest distance which the long side walls 6 of the gas extraction section of the exhaust manifold 3 have from one another and which is smaller than the smallest distance which the long side walls 8 of the gas collecting chamber 5 have from one another.

An apparatus which is characterized by flow-impeding structures arranged between the gas extraction chamber 3 and the gas collection section, 5, above the restriction, the height of which extending in the height direction H is a maximum at half-length and decreases towards the narrow side walls 7.

An apparatus which is characterized in that the flow-impeding structures are formed by reduced-distance zones 10 of the long side walls of the flow channel.

An apparatus which is characterized in that the extraction section of the exhaust manifold (1) is arranged adjacent to a plasma generating device having at least one electrode 13 and a gas inlet gap 15 and the suction opening 2 extends over the width of a support 18 for receiving a substrate 17, in order to extract the process gas flowing through a gap 16 between electrode 13 and substrate 17 from the surface of the substrate 17.

An apparatus which is characterized in that a plurality of extraction units 1 are an integral component of a housing having an electrode arrangement (13) for generating a plasma.

All the disclosed features (by themselves and also combined with one another) are essential to the invention. The subclaims with their features characterize independent inventive further developments of the prior art, in particular for making divisional applications on the basis of these claims.

| Reference list | |
| --- | --- |
| 1 | Extraction unit (exhaust manifold) |
| 2 | Suction opening |
| 3 | Gas extraction chamber (extraction section) |
| 4 | Suction line (Vacuum pump port) |
| 5 | Gas collecting chamber (section) |
| 6 | Long side wall |
| 7 | Narrow side wall |
| 8 | Long side wall |
| 9 | Intermediate space (restriction) |
| 10 | Long side wall spacing |
| 11 | Edge (End) |
| 12 | Edge (End) |
| 12' | Apex |
| 13 | Electrode |
| 14 | Process gas |
| 15 | Gas inlet gap |
| 16 | Gap |
| 17 | Substrate |
| 18 | Support |
| 19 | Narrow edges (ends) |
| a | Cross-sectional plane |
| b | Cross-sectional plane |
| c | Cross-sectional plane |
| d | Cross-sectional plane |
| H | Height direction |
| L | Long side direction |
| R | Edge zones |
| S | Flow direction |
| W | Narrow side direction |
| Z | Central zone |

The invention claimed is:

1. An apparatus for extracting a process gas from a chemical vapor deposition (CVD) or physical vapor deposition (PVD) reactor, the apparatus comprising an exhaust manifold (1) having a flow channel, wherein the flow channel comprises a suction opening (2), a gas extraction chamber (3) adjoining the suction opening (2) in a flow direction (S) and a gas collection chamber (5) disposed downstream of the gas extraction chamber (3) in the flow direction (S) and opening into a suction line (4), wherein the length of the suction opening (2) extending in a long side direction (L) is substantially greater than the width of the suction opening (2) extending in a narrow side direction (W) and wherein the gas extraction chamber (3) and the gas collection chamber (5) are delimited in such a manner by first long side walls (6) and second long side walls (8), respectively, extending in the long side direction (L) and narrow side walls (7) extending in the narrow side direction (W) that a gas flow is formed in the flow channel as a result of a negative pressure produced in the suction line (4), the apparatus characterized in that flow-impeding structures are provided in at least one intermediate space (9) between the gas extraction chamber (3) and the gas collection chamber (5), the flow-impeding structures configured to exert a greater flow resistance on the gas flow within a central zone (Z) located centrally between the narrow side walls (7) than within edge zones (R) arranged between the central zone (Z) and the narrow side walls (7).

2. The apparatus of claim 1, wherein the flow impeding structures are formed by third long side walls (10) of the at least one intermediate space (9) which are less spaced apart from one another than the first long side walls (6) of the gas extraction chamber (3).

3. The apparatus of claim 1, wherein the flow-impeding structures have a height extending in a height direction (H) which is greater in a center of the central zone (Z) than in the edge zones (R).

4. The apparatus of claim 2, wherein the first long side walls (6) of the gas extraction chamber (3), the second long side walls (8) of the gas collection chamber (5), and the third long side walls (10) of the at least one intermediate space (9) each run approximately parallel to one another.

5. The apparatus of claim 1, wherein a first edge (11) of the at least one intermediate space (9) pointing towards the suction opening (2) runs substantially parallel to the suction opening (2).

6. The apparatus of claim 5, wherein a second edge (12) of the at least one intermediate space (9) pointing towards the gas collection chamber (5) runs obliquely to the first edge (11) of the at least one intermediate space (9) pointing towards the suction opening (2).

7. The apparatus of claim 2, wherein the third long side walls (10) of the at least one intermediate space (9) running between an edge (12) of the at least one intermediate space (9) pointing towards the suction line (4) and an edge (11) of the at least one intermediate space (9) pointing towards the suction opening (2) run parallel to one another and have a distance from one another which is smaller than the smallest distance which the first long side walls (6) of the gas extraction chamber (3) have from one another and which is smaller than the smallest distance which the second long side walls (8) of the gas collection chamber (5) have from one another.

8. The apparatus of claim 1, wherein the flow-impeding structures have a height extending in a height direction (H) which is a maximum at half-length of the gas collection chamber (5) and decreases towards the narrow side walls (7).

9. The apparatus of claim 1, wherein the flow-impeding structures are formed by reduced-spacing zones of the flow channel, which in turn are formed by third long side walls (10) of the at least one intermediate space (9).

10. The apparatus of claim 1, wherein the exhaust manifold (1) is arranged adjacent to a plasma generating device having at least one electrode (13) and a gas inlet gap (15), wherein the suction opening (2) extends over a width of a support (18) extending in the long side direction (L), the support (18) for receiving a substrate (17), and wherein the suction opening (2) is configured to extract the process gas flowing through a gap (16) between the at least one electrode (13) and the substrate (17).

11. The apparatus of claim 1, wherein the exhaust manifold (1) is part of a plurality of exhaust manifolds (1) which are an integral component of a housing having an electrode arrangement (13) for generating a plasma.

* * * * *